United States Patent [19]

Nakazato et al.

[11] Patent Number: 4,830,182

[45] Date of Patent: May 16, 1989

[54] RETICLE CASSETTE

[75] Inventors: Hiroshi Nakazato, Ohme; Mamoru Iijima, Yokohama, both of Japan

[73] Assignee: Canon Kabushiki Kaisha, Tokyo, Japan

[21] Appl. No.: 137,746

[22] Filed: Dec. 24, 1987

[30] Foreign Application Priority Data

Dec. 27, 1986 [JP] Japan .................... 61-309209

[51] Int. Cl.$^4$ ............................................. B65D 73/02
[52] U.S. Cl. ........................... 206/334; 206/328; 220/344; 312/290; 174/35 GC; 277/168; 277/180; 277/226; 277/205; 277/53; 277/901
[58] Field of Search ............ 206/328, 334; 220/344, 220/378; 277/168, 180, 226, 205, 53, 55–57, 901; 312/283, 290

[56] References Cited

U.S. PATENT DOCUMENTS

| | | | |
|---|---|---|---|
| 835,836 | 11/1906 | Schulz | 277/57 |
| 1,689,735 | 10/1928 | Losel | 277/56 |
| 2,938,363 | 5/1960 | Dickinson et al. | 312/290 |
| 3,013,852 | 12/1961 | Rockola | 312/290 |
| 3,663,025 | 5/1976 | Natherny et al. | 220/544 |
| 3,923,197 | 12/1975 | Kuhn | 220/344 |
| 4,252,332 | 2/1981 | Nakayama et al. | 277/168 |
| 4,564,880 | 1/1986 | Christ et al. | 206/334 |
| 4,609,103 | 9/1986 | Bimer et al. | 220/334 |
| 4,616,857 | 10/1986 | Woodman et al. | 277/168 |
| 4,699,292 | 10/1987 | Farrell | 220/344 |

FOREIGN PATENT DOCUMENTS

| | | | |
|---|---|---|---|
| 212136 | 4/1956 | Australia | 220/328 |
| 1224105 | 9/1966 | Fed. Rep. of Germany | 277/226 |
| 958411 | 12/1947 | France | 312/290 |
| 78073 | 9/1954 | Netherlands | 312/290 |
| 493575 | 2/1938 | United Kingdom | 220/328 |

Primary Examiner—David T. Fidei
Attorney, Agent, or Firm—Fitzpatrick, Cella, Harper & Scinto

[57] ABSTRACT

A dust-tight container suitably usable in the manufacture of semiconductor microcircuits, for keeping therein a plate-like member such as a reticle, a photomask or a wafer is disclosed. The container has an elastomeric sealing member which is provided along an engaging portion between a container casing and a cover or door of the container, to achieve sufficiently complete dust-tight property of the container to thereby effectively prevent dust or foreign particles from entering into the container. At an engaging portion between the door and the container casing, a protrusion and a recess which mate at the time of closing of the door are provided. These mating protrusion and recess are formed at positions which are on the inner side of the elastomeric sealing member. This effectively prevents particles, adhered to the sealing member and scattering at the time of opening/closing of the door, from entering into the container.

8 Claims, 3 Drawing Sheets

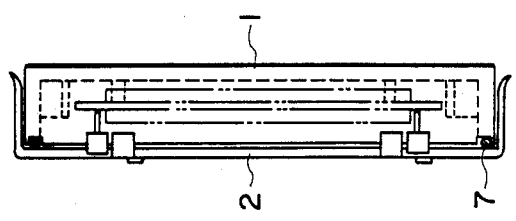
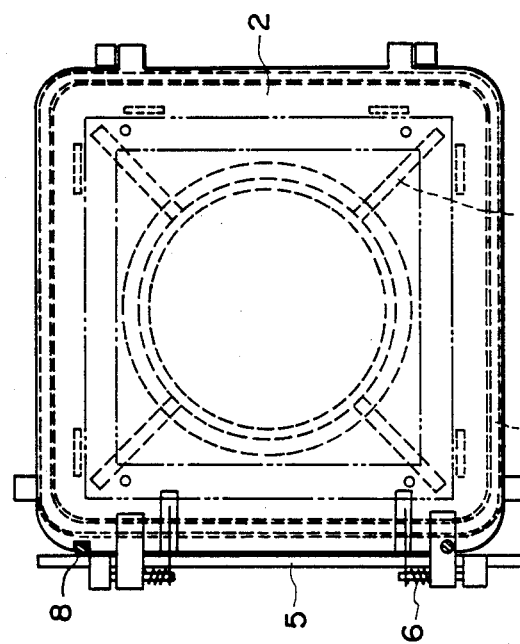
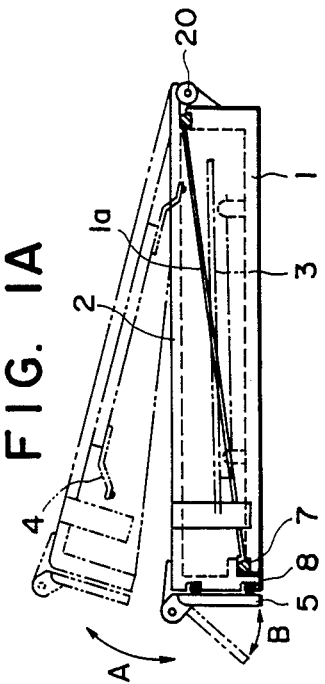
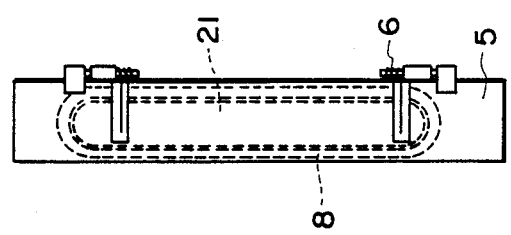

RETICLE CASSETTE

FIELD OF THE INVENTION AND RELATED ART

This invention relates to a container and, more particularly, to a dust-tight container usable in the manufacture of semiconductor devices such as large scaled integrated circuits, for storing therein a plate-like member such as a reticle, a photomask or a wafer.

Because of recent rapid increases in the density of semiconductor microcircuits, adhesion of dust or foreign particles to a reticle, a photomask or a wafer is a serious problem. Particularly, the adhesion of such dust or foreign particles (hereinafter simply "particles") to the reticle or photomask (hereinafter simply "reticle") results in remarkably decreased throughput of a microcircuit manufacturing exposure apparatus. To prevent this, it is desired to keep the reticle in a dust-tight container which is called a "reticle cassette". Further, particularly in step-and-repeat type exposure apparatuses (called "steppers"), it is desired to automatically convey a reticle, held in such a container, to an exposure station defined in the exposure apparatus. Namely, it is desired to extract the reticle out of the container by an unmanned process.

SUMMARY OF THE INVENTION

Usually, a container of the type described above is provided by molded parts each made of resin. To allow insertion of a reticle into the container, usually the container includes a lower member (tray) on which the reticle is to be placed and an upper member which is cooperable with the lower member to provide a casing of a "dust-tight container". Further, in certain type containers, there is provided a swingable door which is openable to allow automatic extraction of the reticle out of the container. It has been found by the inventors of the subject application that these types of containers have an insufficient sealing or dust-tight property at the engaging portion at which the upper and lower members engage or the swingable door engages a wall of the container. It has been confirmed that, in some cases, there exists a gap or clearance of an order of 10-100 microns. Particles having a particle diameter of an order of a few microns adversely affect the manufacture of microcircuits, and such very minute particles can easily enter into the container through such a "large" clearance.

It is accordingly a primary object of the present invention to provide a dust-tight container for use in the manufacture of semiconductor microcircuits, which container effectively prevents entrance of minute particles into the container to thereby assure improved throughput of a microcircuit manufacturing exposure apparatus.

In accordance with an aspect of the present invention, to achieve this object, there is provided a dust-tight container for a reticle for use in the manufacture of microcircuits, said container comprising:

a lower member on which the reticle is to be placed;
an upper member cooperable with said lower member to provide a container casing in which the reticle is accommodated; and
an elastomeric sealing member provided along an engaging portion between said lower and upper members.

Further, in accordance with one preferred form of the present invention, the container is provided with a swingable member which is engageable, when it is closed, with a mating portion of the container. At this portion of the container and the swingable door, there are formed a protrusion and a recess which mate when the swingable member is closed. The protrusion and the recess are formed at such positions that, when they mate at the time of closing the swingable member, they are located at the inner side of a rubber sealing member. This arrangement is very preferable because, even if particles adhered to the rubber sealing member or a member adjacent thereto scatter at the time of opening/closing of the swingable member, entrance of the particles into the container can be effectively and sufficiently prevented.

These and other objects, features and advantages of the present invention will become more apparent upon a consideration of the following description of the preferred embodiments of the present invention taken in conjunction with the accompanying drawings

BRIEF DESCRIPTION OF THE DRAWINGS

FIGS. 1A–1D show a dust-tight container according to one embodiment of the present invention, wherein FIG. 1A is a top plan view, FIG. 1B is a side view, FIG. 1C is a front view and FIG. 1D is a rear view.

FIGS. 2A–2C show a dust-tight container according to another embodiment of the present invention, wherein FIG. 2A is a top plan view and FIGS. 2B and 2C are side views.

DESCRIPTION OF THE PREFERRED EMBODIMENTS

Figure 2A:
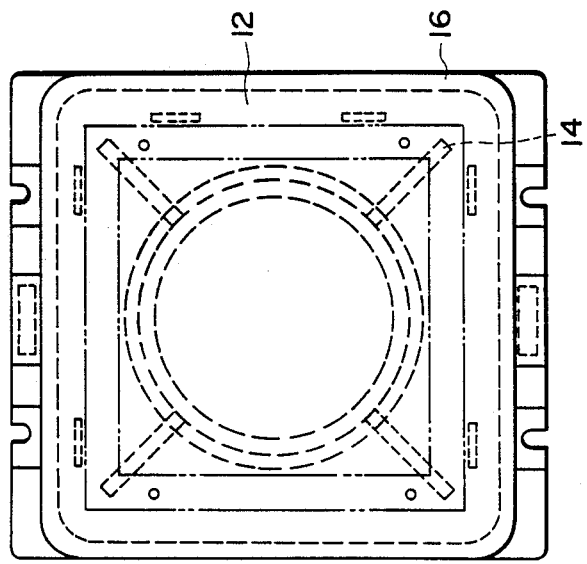

Referring first to FIGS. 1A–1D, there is shown a dust-tight container according to one embodiment of the present invention. In this embodiment, the invention is applied to a container for keeping therein a reticle which is denoted at 3 in these figures. The reticle 3 is placed on a lower member 1 which, in this embodiment, is a tray having a shape as illustrated. The lower member 1 is adapted to be covered by an upper member 2 (which may be called "upper lid"), whereby a sealed casing generally having a rectangular shape is provided. The upper member 2 is pivotably coupled to the lower member 1 by means of a hinge 20 which is provided at an upper and rear edge portion of the lower member 1, such that the upper member 2 is swingable as denoted by an arrow A to open/close the container. Side walls of the lower and upper members 1 and 2 are formed with opposing faces, denoted at 1a in FIG. 1B, which are inclined substantially along a diagonal of the "side face" of the casing as illustrated. The opposing faces of the side walls of the lower and upper members 1 and 2 are adapted to engage with each other when the upper member 2 is closed. Thus, these opposing faces cooperate to provide a "seal".

As best seen in FIG. 1B and as described hereinbefore, the upper edge of each side wall of the lower member 1, defining a portion of the "opening" of the lower member 1, is inclined downwardly in a direction toward the front of the container (the left-hand side in FIG. 1B). With this arrangement, a portion of the reticle 3 placed on the lower member 1 projects out of the lower member 1 when the upper member 2 is opened as depicted by phantom lines in FIG. 1B. Thus, the insertion and extraction of the reticle 3 into and out of the container is facilitated. The upper member 2 is provided with reticle keeping members 4 which are adapted to resiliently press the reticle 3 toward the lower member 1 when the upper member 2 is closed, thereby to hold the reticle immovable within the container. An opening 21 is formed in a front wall of the upper member 2. The opening 21 is provided to allow automatic extraction and insertion of the reticle 3 out of and into the container even when the upper member 2 is closed. The opening 21 is normally closed by a door 5 which is swingably mounted to the upper member 2, such that the door 5 is swingable as denoted by an arrow B in FIG. 1B to open/close the front of the space, which is defined by the combined lower and upper members 1 and 2. The door 5 is urged by biasing spring forces of springs 6, in a direction normally closing the front opening of the upper member 2.

A first elastomeric sealing member 7 is provided between opposing and engaging faces of the walls of the lower and upper members 1 and 2. As best seen in FIG. 1A, the sealing member 7 extends along the entire periphery of the container. In this embodiment, the sealing member 7 is fitted into a groove formed in and along the top engaging faces of the walls of the lower member 1 which faces opposite to and engages with the corresponding faces of the upper member 2 when the upper member is closed. Also, a second elastomeric sealing member 8 is provided around the opening 21, as best seen in FIG. 1C. The sealing member 8 is fitted into a groove which is formed in a side face of the upper member 2 which faces opposite to the inner surface of the door 5 when it is closed. Each sealing member 7 or 8 may be provided by a hollow tubular member such as illustrated in FIGS. 3A and 3B, and it may be made of silicone rubber, vinyl chloride resin or other suitable synthetic resin.

Figure 3A:
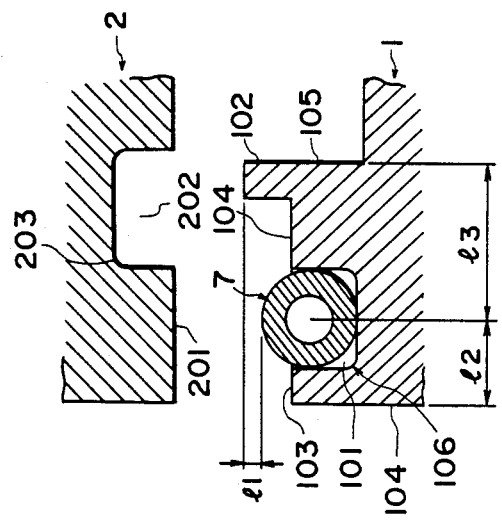
FIGS. 3A and 3B are enlarged fragmentary sections, showing details of the sealing function of the container of the present invention.

As best seen in FIG. 3A, the sealing member 7 partially projects upwardly from the lower member 1 when the upper member 2 is open from the lower member 1. If the upper member 2 is closed to the lower member 1 as shown in FIG. 3B, the elastomeric sealing member 7 elastomerically deforms to thereby substantially completely seal the lower and upper members 1 and 2. The second elastomeric sealing member 8 provided between the upper member 2 and the door 5 functions similarly. Since such an elastomeric sealing member 7 or 8 having a hollow tubular shape can be deformed with relatively small pressure, there is a smaller possibility of the creation of dust or particles.

Details of the engagement between the lower and upper members 1 and 2 will now be described. It should be noted that the engagement between the upper member 2 and the door 5 may be provided in the manner essentially the same as described below.

Figure 3B:
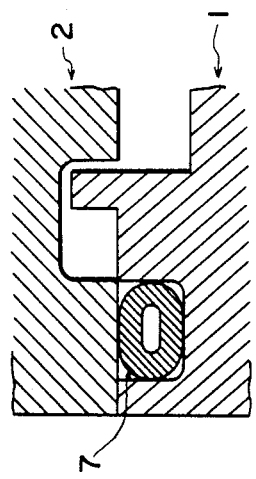

Referring to FIGS. 3A and 3B, the lower member 1 is provided with a groove 101 which is formed along the entire periphery of the lower member 1 and which is adapted to accommodate therein the elastomeric sealing member 7. The sealing member 7 is fitted into the groove 101 and is held immovable within the groove 101 by means of its elasticity. However, the sealing member 7 may be fixed within the groove 101 by use of a bonding agent. The groove 101 has a sectional shape having rounded corners as denoted at 106 in FIG. 3A. This is to facilitate the washing of the container to easily clean out particles adhered to the groove 101.

The groove 101 is formed at such a position that, when the distance from the center of the sealing member 7 held within the groove 101 to the outside surface 104 of the lower member 1 is denoted by $l_2$ and the distance from the center of the sealing member 7 to the inside surface 105 of the lower member 1 is denoted by $l_3$, the distances $l_2$ and $l_3$ satisfy the relation $l_2 < l_3$. This is made to minimize the possibility that, if particles adhered to the sealing member 7 scatter at the time of the opening/closing movement of the upper member 2, the scattered particles enter into the container. Further, the lower member 1 is provided with a protrusion 102 which extends along the inside surface 105. The protrusion 102 extends upwardly beyond the sealing member supporting face (i.e. the engaging surface denoted at 103 and 104). The protrusion 102 is effective to prevent particles, scattered at the time of opening/closing of the upper member 2, from entering into the container. As best seen in FIG. 3A, the protrusion 102 has a height which is higher by a length $l_1$ than the top of the elastomeric sealing member 7 in the state of FIG. 3A. This is made to prevent entrance, into the container of such particles which are created just before the engaging face 201 of the upper member 2 contacts the sealing member 7 and/or just after the engaging face 201 disengages from the sealing member 7 and which particles may otherwise easily enter into the container. It should be noted that a plurality of protrusions may be formed in an array in a direction toward the inside of the container, so as to provide a so-called labyrinth seal. This assures further reduction of the possibility of the contamination of the reticle 3 kept in the container, by particles.

The upper member 2 is provided with a recess 202 which is adapted to receive the protrusion 102 of the lower member when the upper member 2 is closed to the lower member 1. Similarly to the groove 101, the recess 202 has a sectional shape having rounded corners such as depicted at 203 in FIG. 3A. This is for the same reason as described hereinbefore. The recess 202 has a width which is significantly larger than the width of the protrusion 102. This is made to effectively avoid that the engaging face 201 of the upper member 2 contacts the engaging face portion 104 of the lower member 1 when the upper member 2 is closed to the lower member 1. Thus, the engaging face 201 of the upper member 2 contacts only the sealing member 7 and the engaging face portion 103 of the lower member 1 when the upper member 2 is closed. This is very preferable because it effectively reduces the possibility of scattering of particles adhered to the engaging surface portion 104, by the opening/closing of the upper member 2. In place of providing a wide recess such as at 202, the height of the face portion 104 may be made slightly lower than that of the face portion 103. In this case also, the non-contact relation can be maintained between the face portion 104 of the lower member 1 and the engaging face 201 of the upper member 2. In this case, the recess 202 may be formed so as to have a width which is slightly wider than the width of the protrusion 102.

Figure 4:
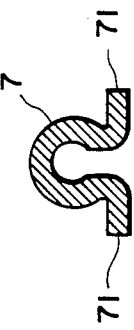
FIG. 4 is an enlarged section of an elastomeric sealing member usable in the present invention.

The sealing member 7 may have a sectional shape such as depicted in FIG. 4, wherein supporting tabs extend outwardly from the ends of an arcuate-section portion. Such a sectional shape can be easily manufactured by molding. Further, various sizes and configurations having different elasticities can be made easily. It should be noted that the sealing member 7 may be made of an electrically conductive material so as to effectively prevent adhesion of particles thereto. This is also the case with the sealing member 8.

Figure 2B:
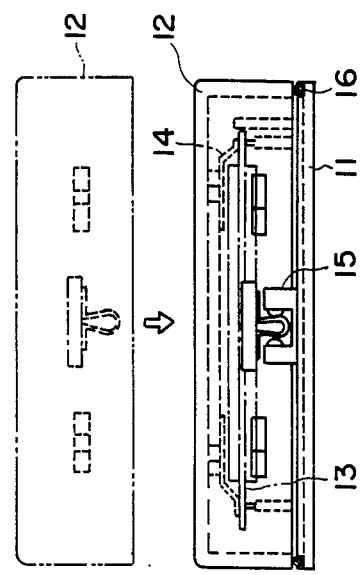
Figure 2C:
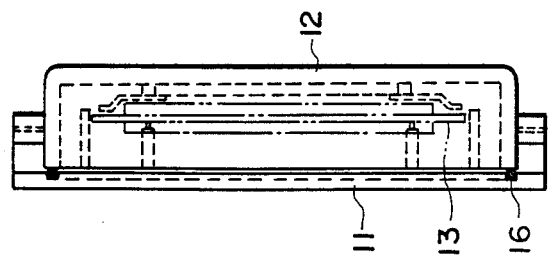

Referring now to FIGS. 2A-2C, there is shown a dust-tight container according to another embodiment of the present invention. In this embodiment, the container includes a lower member 11 (tray) having a generally planar shape. An upper member 12 (lid) is placed on the lower member 11 to provide a sealed casing having a generally rectangular shape. A reticle 13 is placed on the lower member 11 and is covered by the upper member 12 which is put on the lower member 11 from the above as best seen in FIG. 2B. The upper member 12 is coupled to the lower member 11 by means of a coupling mechanism 15. The side walls of the upper member 12 engage the outer peripheral edge portion of the lower member 11, and along such outer peripheral edge portion, an elastomeric sealing member 16 is provided. The sealing member 16 has a structure and a function which are similar to those of the sealing member 7 of the foregoing embodiment.

In accordance with the present invention, which has hitherto been described, an elastomeric sealing member is provided between opposing and engaging surface portions of two components of the container. With such simple structure, adhesion of particles to an article contained in the container can be effectively prevented, with an advantage of ensuring improved throughput of a microcircuit manufacturing apparatus.

Further, the container can be made with reduced costs and, additionally, can be washed easily.

While the invention has been described with reference to the structures disclosed herein, it is not confined to the details set forth and this application is intended to cover such modifications or changes as may come within the purposes of the improvements or the scope of the following claims.

What is claimed is:

1. A dust-tight container for accommodating a reticle to be used to print a pattern on a semiconductor wafer, said container comprising:

a lower member on which the reticle is to be placed;

an upper member cooperable with said lower member to provide a container casing in which the reticle is to be accommodated, wherein said lower member has an engaging surface for engagement with said upper member and a groove formed along said engaging surface; and an elastomeric sealing member fitted into said groove and held thereby;

wherein said lower member further has a protrusion provided at an interior position on said lower member with respect to said groove, said protrusion having a height higher than that of said elastomeric sealing member, and wherein said engaging surface is formed at an exterior position of said lower member with respect to said groove.

2. A dust-tight container for accommodating a reticle to be used to print a pattern on a semiconductor wafer, said container comprising:

a lower member on which the reticle is to be placed;

an upper member cooperable with said lower member to provide a container casing in which the reticle is to be accommodated, wherein said lower member has an engaging surface for engagement with said upper member and a groove formed along said engaging surface; and an elastomeric sealing member fitted into said groove and being held thereby;

wherein said lower member further has a protrusion at an interior position of said lower member with respect to said groove, said upper member has a recess for receiving said protrusion when said upper member engages with said engaging surface and said elastomeric sealing member, and said engaging surface is formed at an exterior position of said lower member with respect to said groove.

3. A container according to claim 1, wherein said groove satisfies the relationship:

$L2 < L3$ where $L2$ denotes the distance from the center of said groove to an outer peripheral surface of said lower member and $L3$ denotes the distance from the center of said groove to an inner peripheral surface of said lower member.

4. A container according to claim 3, wherein said upper member includes a door, said upper member is pivotably supported by said lower member and said door is pivotably supported by said upper member.

5. A container according to claim 4, wherein said upper member has an elastomeric sealing member in contact with said door.

6. A container according to claim 2, wherein said groove satisfies the relationship;

$L2 < L3$ where $L2$ denotes the distance from the center of said groove to an outer peripheral surface of said lower member and $L3$ denotes the distance from the center of said groove to an inner peripheral surface of said lower member.

7. A container according to claim 6, wherein said upper member includes a door, said upper member is pivotably supported by said lower member and said door is pivotably supported by said upper member.

8. A container according to claim 7, wherein said upper member has an elastomeric sealing member in contact with said door.

* * * * *